US 8,288,765 B2

(12) United States Patent
Inoue

(10) Patent No.: US 8,288,765 B2
(45) Date of Patent: Oct. 16, 2012

(54) ORGANIC TRANSISTOR, METHOD FOR PRODUCING ORGANIC TRANSISTOR, ELECTRO-OPTICAL DEVICE, AND ELECTRONIC EQUIPMENT

(75) Inventor: Keiichi Inoue, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 207 days.

(21) Appl. No.: 12/768,237

(22) Filed: Apr. 27, 2010

(65) Prior Publication Data

US 2010/0283044 A1    Nov. 11, 2010

(30) Foreign Application Priority Data

May 7, 2009  (JP) ................................. 2009-112509
Mar. 8, 2010  (JP) ................................. 2010-050231

(51) Int. Cl.
  *H01L 35/24* (2006.01)
(52) U.S. Cl. .................. 257/40; 257/E51.001
(58) Field of Classification Search ................ 257/40, 257/E51.001
  See application file for complete search history.

(56) References Cited

U.S. PATENT DOCUMENTS

| 7,202,495 B2 * | 4/2007 | Unno ............................. 257/40 |
| 7,282,735 B2 * | 10/2007 | Wu et al. ........................ 257/40 |
| 7,364,940 B2 | 4/2008 | Kim et al. |
| 2004/0222412 A1 * | 11/2004 | Bai et al. ........................ 257/40 |
| 2007/0096088 A1 | 5/2007 | Tano et al. |

FOREIGN PATENT DOCUMENTS

| JP | A-2003-86805 | 3/2003 |
| JP | A-2006-191115 | 7/2006 |
| JP | A-2007-150246 | 6/2007 |
| JP | A-2008-172028 | 7/2008 |
| JP | A-2009-290237 | 12/2009 |

* cited by examiner

*Primary Examiner* — Anthony Ho
(74) *Attorney, Agent, or Firm* — Oliff & Berridge, PLC

(57) ABSTRACT

An organic transistor includes: a source electrode, a drain electrode, an organic semiconductor film provided between the source electrode and the drain electrode, a gate electrode, and a gate dielectric film provided between the organic semiconductor film and the gate electrode, the gate dielectric film including a first gate dielectric film in contact with the gate electrode and a second gate dielectric film in contact with the organic semiconductor film, the second gate dielectric film having a hydrocarbon compound containing carbon and hydrogen atoms.

16 Claims, 10 Drawing Sheets

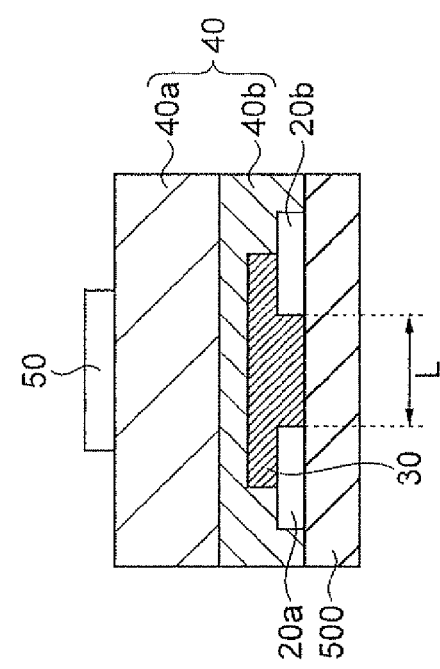
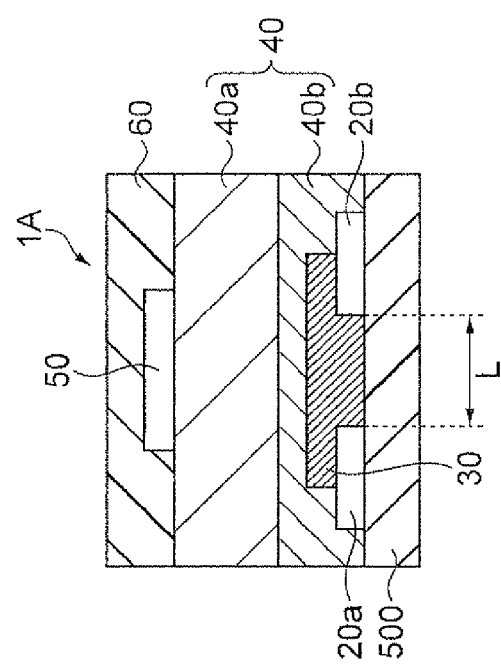
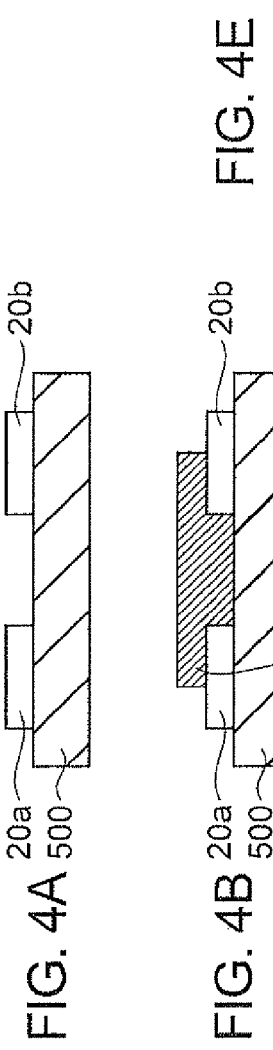
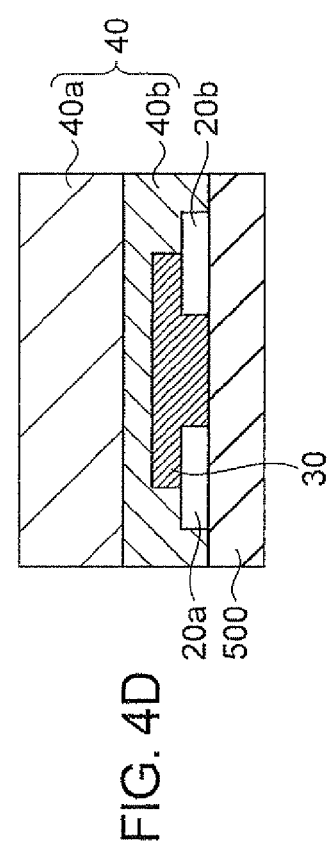
FIG. 4A
FIG. 4B
FIG. 4C
FIG. 4D
FIG. 4E
FIG. 4F Table 1

| | Organic semi-conductor film | First gate dielectric film | Second gate dielectric film | Gate electrode | Mobility in $N_2$ ($cm^2/Vs$) | Mobility in Air ($cm^2/Vs$) | ON/OFF ratio in $N_2$ | ON/OFF ratio in Air | Vth in $N_2$ (V) | Vth in Air (V) | ΔVth | Vbd in Air (V) |
|---|---|---|---|---|---|---|---|---|---|---|---|---|
| Example 1 | P3HT | CYTOP | TTC | Ag-IJ | $5.0 \times 10^{-2}$ | $2.9 \times 10^{-2}$ | $4.4 \times 10^6$ | $1.4 \times 10^6$ | 0.0 | -0.2 | -0.2 | 90 |
| Example 2 | P3HT | CYTOP | P1B | Ag-IJ | $3.0 \times 10^{-2}$ | $2.1 \times 10^{-2}$ | $2.5 \times 10^6$ | $1.3 \times 10^6$ | 0.0 | -0.4 | -0.4 | 85 |
| Example 3 | P3HT | PMMA | TTC | Ag-IJ | $8.4 \times 10^{-3}$ | $7.0 \times 10^{-3}$ | $6.0 \times 10^5$ | $3.0 \times 10^5$ | -1.0 | -3.0 | -2.0 | 68 |
| Example 4 | P3HT | Compound A | TTC | Ag-IJ | $4.0 \times 10^{-2}$ | $3.5 \times 10^{-2}$ | $3.7 \times 10^6$ | $2.0 \times 10^6$ | 0.0 | -0.1 | -0.1 | 100 |
| Comparativ Example 1 | P3HT | CYTOP | — | Ag-IJ | $7.3 \times 10^{-3}$ | $3.1 \times 10^{-4}$ | $3.2 \times 10^3$ | $1.5 \times 10^2$ | 2.0 | -8.0 | -10.0 | 62 |
| Comparativ Example 2 | P3HT | PMMA | — | Ag-IJ | $2.0 \times 10^{-4}$ | $1.0 \times 10^{-5}$ | $1.0 \times 10^5$ | $2.7 \times 10^3$ | -3.0 | -15.0 | -12.0 | 43 |
| Comparativ Example 3 | P3HT | P1B | — | Ag-IJ | $3.0 \times 10^{-3}$ | $5.1 \times 10^{-5}$ | $2.0 \times 10^5$ | $8.7 \times 10^3$ | -2.0 | -13.0 | -11.0 | 40 |
| Comparativ Example 4 | P3HT | Compound A | — | Ag-IJ | $4.5 \times 10^{-3}$ | $1.1 \times 10^{-3}$ | $3.5 \times 10^3$ | $1.8 \times 10^2$ | 1.0 | -4.0 | -5.0 | 65 |
| Comparativ Example 5 | P3HT | PMMA | Compound A | Ag-IJ | $4.7 \times 10^{-3}$ | $8.5 \times 10^{-4}$ | $5.0 \times 10^3$ | $7.7 \times 10^2$ | -3.0 | -14.0 | -11.0 | 45 |

FIG. 8

ORGANIC TRANSISTOR, METHOD FOR PRODUCING ORGANIC TRANSISTOR, ELECTRO-OPTICAL DEVICE, AND ELECTRONIC EQUIPMENT

The entire disclosure of Japanese Patent Application Nos: 2009-112509, filed May 7, 2009 and 2010-050231, filed Mar. 8, 2010 are expressly incorporated by reference herein.

BACKGROUND

1. Technical Field

The present invention relates to an organic transistor, a method for producing an organic transistor, an electro-optical device, electronic equipment, etc.

2. Related Art

In recent years, organic transistors containing organic materials with electrical semiconduction (organic semiconductor materials) have been developed. For their suitability for reduction in thickness and weight, flexibility, low material cost, and other advantages, such organic transistors are expected to serve as switching elements in a flexible display or the like.

In such an organic transistor, an inorganic material may be used as a gate dielectric film material (see, e.g., JP-A-2003-86805). However, this impairs the flexibility, an advantage of an organic transistor, and thus is problematic. This also presents a process problem in that because a gas-phase process or a high-temperature heat-treatment is employed for forming the gate dielectric film, the formation of the gate dielectric film requires time and effort, cost, time, and the like. Further, in an organic transistor obtained by a method in which a gate dielectric film is formed after the formation of an organic semiconductor film, the organic semiconductor film may be deteriorated or degraded during the formation of the gate dielectric film. Therefore, it is generally difficult to achieve excellent transistor properties using a typical process that uses an inorganic material.

In order to avoid such inconveniences, as materials for forming a gate dielectric film, organic materials such as phenolic resin and acrylic resin are occasionally used, for example. However, these resins have high hygroscopicity, and generally cause the following problem. Specifically, when such an organic transistor is used in air, the gate dielectric film therein absorbs moisture, and the moisture content in the gate dielectric film is thus increased; this is likely to cause a shift of the threshold voltage (Vth), an increase in the gate leakage current, and dielectric breakdown. There also is an organic transistor in which a fluorine-containing polymer is used for a gate dielectric film or for the interface between a gate dielectric film and an organic semiconductor film (see, e.g., JP-A-2006-191115). Fluorine-containing polymers typically have low hygroscopicity. Therefore, an organic transistor that operates stably in air can be produced. Further, because fluorine is electronegative, in the state of being in contact with an organic semiconductor film, electrons emitted therefrom at the time of the formation of holes can be accommodated. This thus provides an advantage in that high carrier mobility can be achieved in an organic transistor where the carriers are holes. However, this may simultaneously cause an increase in the OFF current value. In such a case, a high ON/OFF ratio cannot be obtained, resulting in a decrease in the switching performance as a transistor.

Organic transistors having a gate dielectric film with a laminated structure have also been developed (see, e.g., JP-A-2007-150246 and JP-A-2008-172028). However, these disclosures relate to the control of the wettability of an organic semiconductor film or a gate dielectric film or to the inhibition of the degradation of the interface between an organic semiconductor film and a gate dielectric film. At present, no organic transistor with high carrier mobility, a high ON/OFF ratio, and practically stable operation in air has been established.

SUMMARY

An advantage of some aspects of the invention is to provide an organic transistor that operates well in air, is less prone to degradation of electrical properties over time, and has high carrier mobility together with a high ON/OFF ratio; a method for producing the organic transistor; and an electro-optical device and electronic equipment provided with the organic transistor and having high reliability.

The invention can be implemented in the following modes or application examples.

Application Example 1

An organic transistor of this application example includes a source electrode; a drain electrode; an organic semiconductor film provided between the source electrode and the drain electrode; a gate electrode; and a gate dielectric film provided between the organic semiconductor film and the gate electrode, the gate dielectric film including a first gate dielectric film in contact with the gate electrode and a second gate dielectric film in contact with the organic semiconductor film. The second gate dielectric film has a hydrocarbon compound containing carbon and hydrogen atoms.

According to such a configuration, because a hydrocarbon-based material having lower polarity than that of fluorine-based materials is used for the second gate dielectric film, an excellent interface can be formed between the second gate dielectric film and the organic semiconductor film. That is, this inhibits the formation of a trap level that hinders carrier transport at the time when the organic semiconductor film becomes conductive. Therefore, an organic transistor having high carrier mobility and a high ON/OFF ratio can be obtained.

Application Example 2

In the organic transistor of the above application example, the second gate dielectric film may be provided between the source electrode and the drain electrode in a planar manner.

According to such a configuration, at the interface between the organic semiconductor film and the second gate dielectric film, an excellent interface with a reduced number of trap levels can be formed.

Application Example 3

In the organic transistor of the above application example, it is preferable that the second gate dielectric film is provided to at least cover the top surface of the organic semiconductor film facing the gate electrode.

According to such a configuration, as compared with Application Example 2, an excellent interface with a reduced number of trap levels can be formed in a wider area.

Application Example 4

In the organic transistor of the above application example, it is more preferable that the second gate dielectric film is provided to cover the top surface of the organic semiconductor film facing the gate electrode and the side surface thereof continuous to the top surface.

According to such a configuration, as compared with the case where the side surface of the organic semiconductor film is not covered with the second gate dielectric film, carrier trapping on the side surface can be prevented, thereby realizing stable carrier mobility.

Application Example 5

In the organic transistor of the above application example, it is preferable that the organic transistor has a top-gate structure, and that the first gate dielectric film has a fluorine-atom-containing organic compound.

This provides, for example, a top-gate organic transistor having low hygroscopicity and less prone to property degradation over time.

Application Example 6

In the organic transistor of the above application example, alternatively, it is also preferable that the organic transistor has a bottom-gate structure, and that the first gate dielectric film has an inorganic compound or a fluorine-atom-containing organic compound.

This provides, for example, a bottom-gate organic transistor having low hygroscopicity and less prone to property degradation over time.

Application Example 7

In the organic transistor of the above application example, it is preferable that the fluorine-atom-containing organic compound includes a carbocyclic hydrocarbon compound having fluorine atoms evenly bonded to the carbocyclic side chains thereof.

According to such a configuration, fluorine atoms are evenly bonded to the carbocyclic side chains, and the polarity is thus not biased. Therefore, in the case where, for example, a liquid-phase process is employed for the formation of the first gate dielectric film, the solvent to be used can be selected from a wider range. That is, the production of the organic semiconductor film is facilitated.

Application Example 8

In the organic transistor of the above application example, it is preferable that the first gate dielectric film has a thickness greater than the thickness of the second gate dielectric film.

This provides an organic transistor where the first gate dielectric film reliably insulates the source electrode and the drain electrode or insulates the gate electrode, and which operates at low voltage and is less prone to property degradation over time.

Application Example 9

In the organic transistor of the above application example, it is preferable that the second gate dielectric film has a thickness of 5 nm to 500 nm.

This provides an organic transistor where the source electrode, the drain electrode, and the organic semiconductor film are reliably insulated from the gate electrode, and which operates at low voltage.

Application Example 10

In the organic transistor of the above application example, it is preferable that the second gate dielectric film is formed of a hydrocarbon compound having a carbon number of 30 or more.

This provides an organic transistor that operates stably at least at ordinary temperature.

Application Example 11

An electro-optical device of this application example includes a substrate; the organic transistor of the above application example located on the substrate; a pixel electrode electrically connected to the organic transistor; and an electro-optical material located on the pixel electrode.

This provides an electro-optical device that allows stable operation and has high reliability.

Application Example 12

Electronic equipment of this application example includes the electro-optical device of the above application example.

This provides electronic equipment that allows stable operation and has high reliability.

Application Example 13

The method of this application example for producing an organic transistor includes: forming a source electrode and a drain electrode on a substrate; forming an organic semiconductor film between the source electrode and the drain electrode; forming a second gate dielectric film on the organic semiconductor film, the second gate dielectric film having a hydrocarbon compound containing carbon and hydrogen atoms; forming a first gate dielectric film on the second gate dielectric film, the first gate dielectric film having a fluorine-atom-containing organic compound; and forming a gate electrode on the first gate dielectric film.

Such a production method provides, for example, a top-gate organic transistor which has high carrier mobility and a high ON/OFF ratio and is less prone to property degradation over time.

Application Example 14

A method of this application example for producing another organic transistor includes: forming a gate electrode on a substrate; forming a first gate dielectric film to cover the gate electrode, the first gate dielectric film having an inorganic compound or a fluorine-atom-containing organic compound; forming a second gate dielectric film on the first gate dielectric film, the second gate dielectric film having a hydrocarbon compound containing carbon and hydrogen atoms; forming a source electrode and a drain electrode on the second gate dielectric film; and forming an organic semiconductor film between the source electrode and the drain electrode.

Such a production method provides, for example, a bottom-gate organic transistor that has high carrier mobility and a high ON/OFF ratio and is less prone to property degradation over time.

Application Example 15

In the method of the above application example for producing an organic transistor, the forming an organic semiconductor film is performed using a liquid-phase process that uses a fluid substance containing a material for forming the organic semiconductor film.

According to such a production method, the fluid substance is applied to a predetermined region and then solidified to form the organic semiconductor film. Unlike vacuum deposition or the like, this method does not require complicated production facilities, and, therefore, the organic semiconductor film can be formed at a high cost/performance ratio.

Application Example 16

In the method of the above application example for producing an organic transistor, alternatively, the forming a gate electrode is performed using a liquid-phase process that uses a fluid material for forming an electrode, the fluid material being a dispersion of an electrically conductive polymer or metal particles in an aqueous dispersion medium.

In such a liquid-phase process, for example, the material for forming an electrode may be supplied by ink-jet printing to readily form a gate electrode with high dimensional accuracy.

BRIEF DESCRIPTION OF THE DRAWINGS

The invention will be described with reference to the accompanying drawings, wherein like numbers reference like elements.

FIGS. 4A to 4F are diagrams for explaining a method for producing the organic transistor shown in FIGS. 2A and 2B (longitudinal sectional view).

FIG. 8 is a table showing the configuration of organic transistors produced in the Examples and Comparative Examples, together with the results of evaluation of their electrical properties.

DESCRIPTION OF EXEMPLARY EMBODIMENTS

Hereinafter, an organic transistor, a method for producing an organic transistor, an electro-optical device, and electronic equipment according to some preferred embodiments of the invention will be explained in detail. The following explanation will take as an example the case where the organic transistor is applied in an active-matrix device.

Active-Matrix Device

Figure 1:
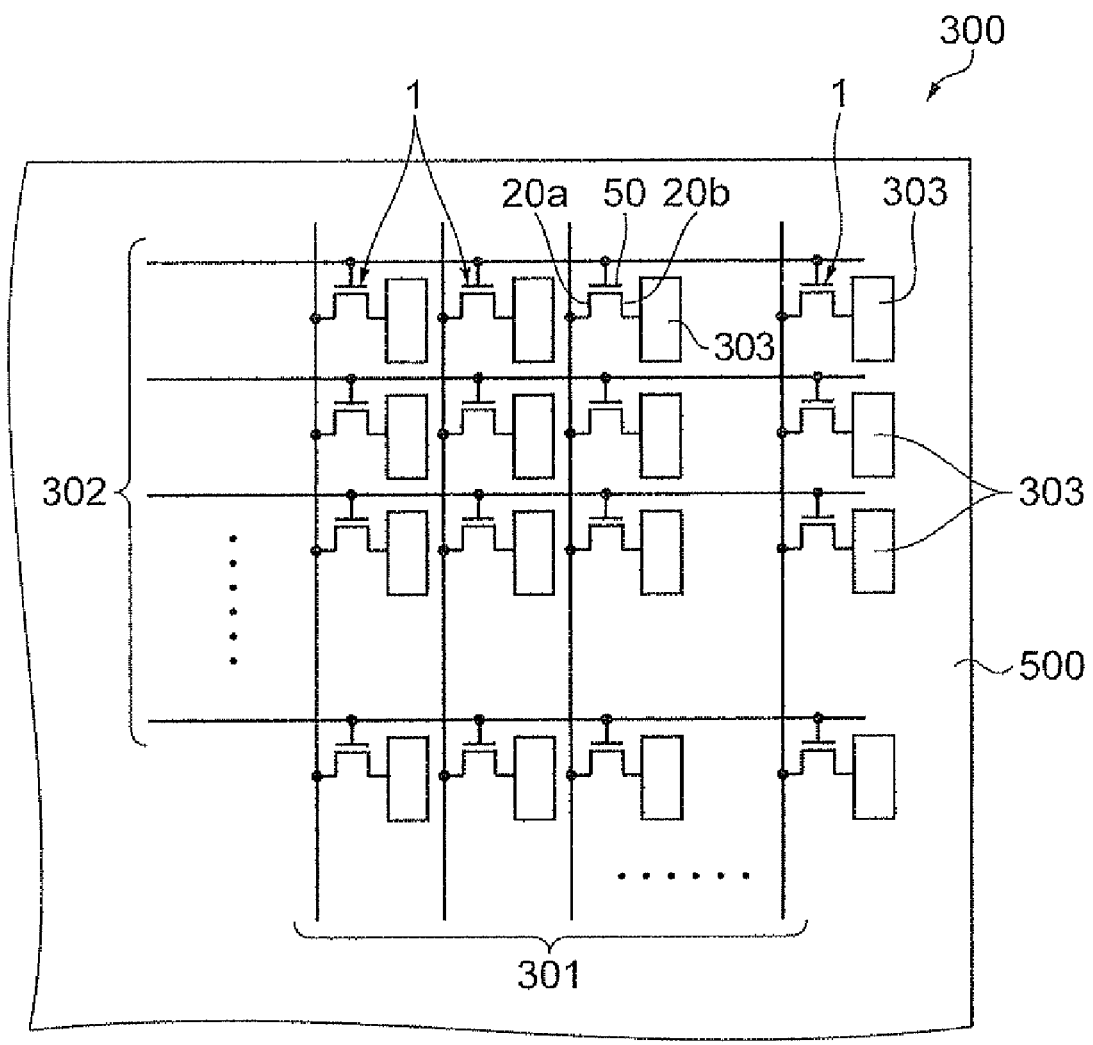
FIG. 1 is a block diagram showing the configuration of an active-matrix device having applied thereto an organic transistor according to an aspect of the invention.
Figure 2A:
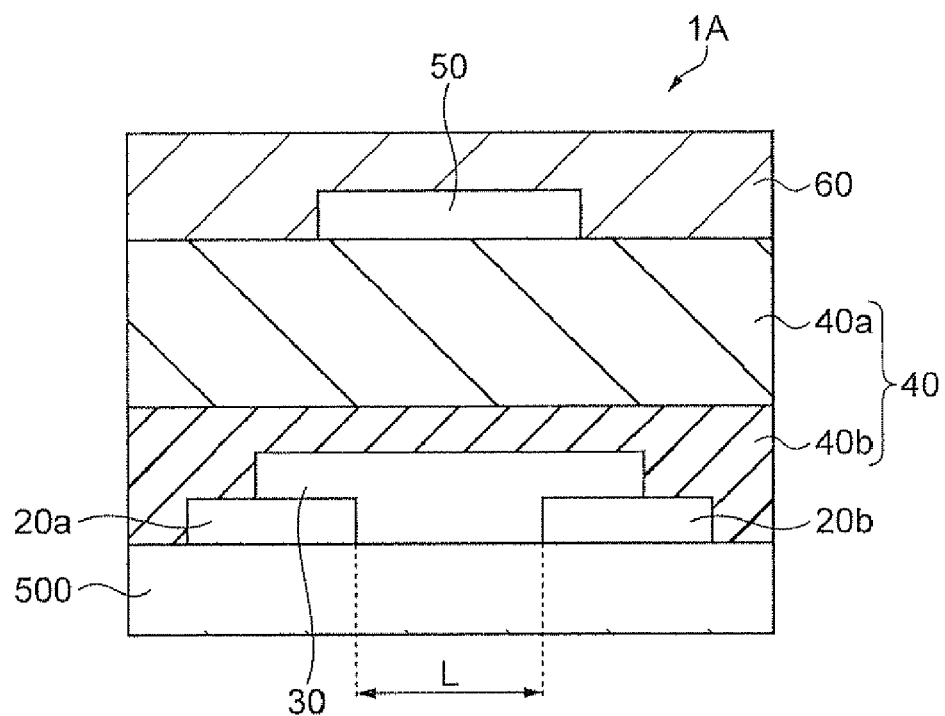
FIGS. 2A and 2B show the configuration of a top-gate organic transistor for use in the active-matrix device shown in FIG. 1 (A: longitudinal sectional view, B: plan view).
Figure 2B:
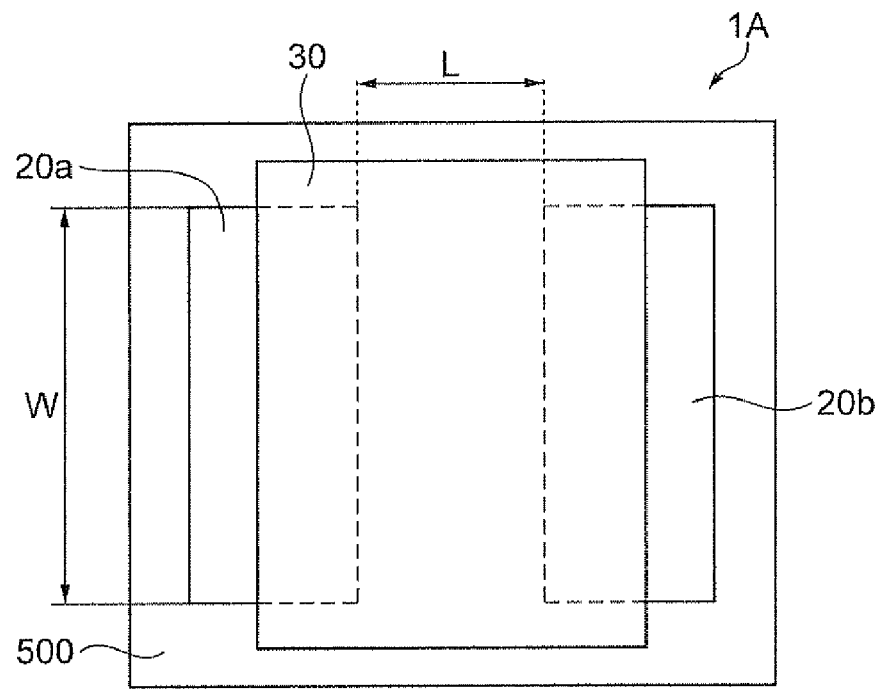
Figure 3A:
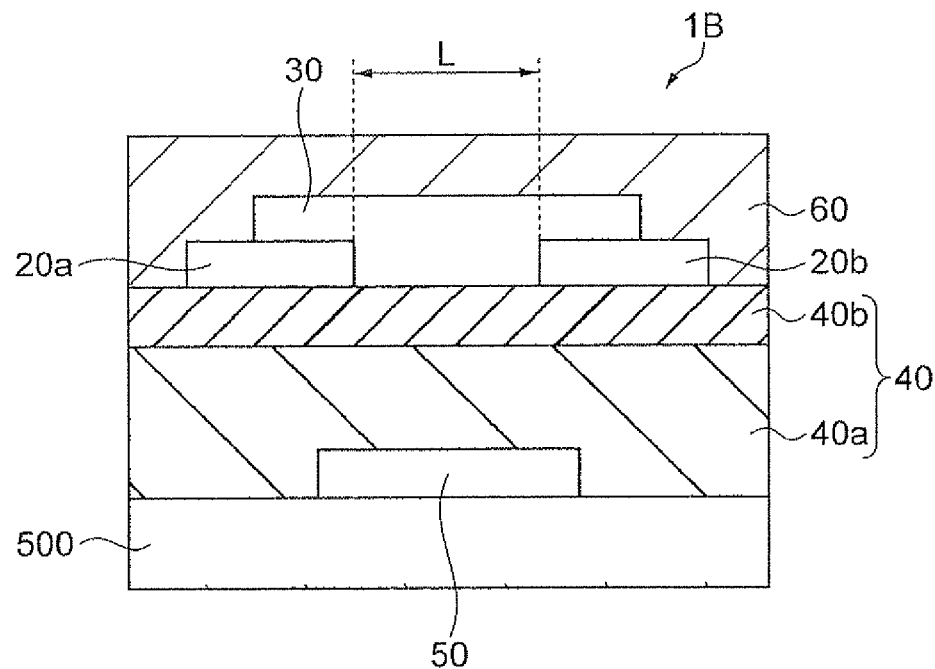
FIGS. 3A and 3B show the configuration of a bottom-gate organic transistor for use in the active-matrix device shown in FIG. 1 (A: longitudinal sectional view, B: plan view).
Figure 3B:
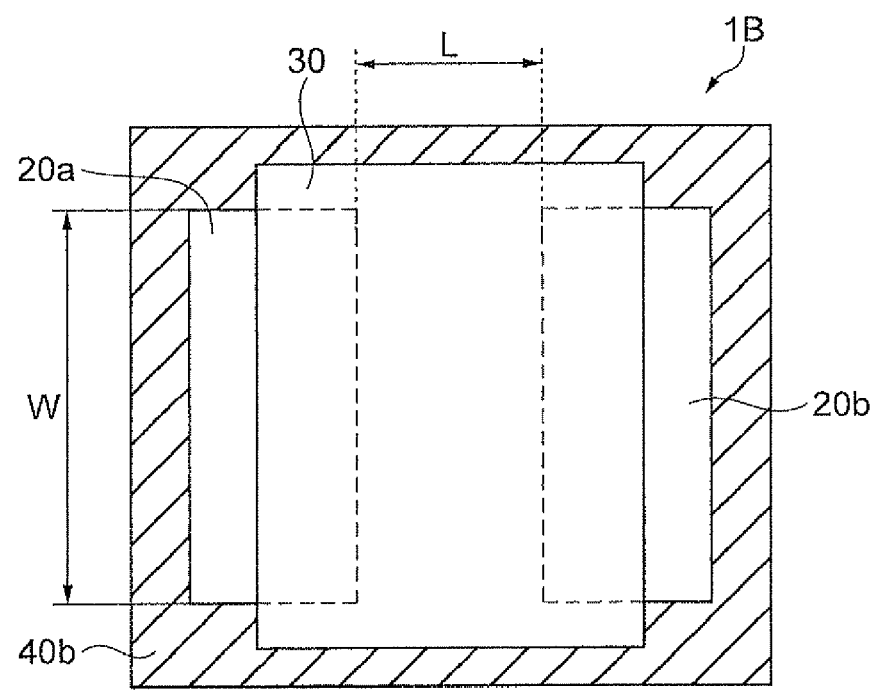

FIG. 1 is a block diagram showing the configuration of an active-matrix device having applied thereto an organic transistor according to this embodiment. FIGS. 2A and 2B show the configuration of a top-gate organic transistor for use in the active-matrix device shown in FIG. 1 (A: longitudinal sectional view, B: plan view). FIGS. 3A and 3B show the configuration of a bottom-gate organic transistor for use in the active-matrix device shown in FIG. 1 (A: longitudinal sectional view, B: plan view). FIGS. 4A to 4F are diagrams for explaining a method for producing the organic transistor shown in FIGS. 2A and 28 (longitudinal sectional view).

An active-matrix device 300 shown in FIG. 1 includes a substrate 500, and mutually intersecting data lines 301 and scanning lines 302 both provided on the substrate 500. Near each of the intersections of the data lines 301 and the scanning lines 302, an organic transistor 1 and an pixel electrode 303 are provided.

In each organic transistor 1, an gate electrode is connected to one of the scanning lines 302, a source electrode 20a is connected to one of the data lines 301, and a drain electrode 20b is connected to one of the pixel electrodes (individual electrodes) 303. That is, pixels each having the pixel electrode 303 are arranged in matrix in the direction of extension of the data lines 301 and in the direction of extension of the scanning lines 302.

Hereinafter, the organic transistor 1 will be explained in detail taking the top-gate organic transistor shown in FIG. 2A as an example. As shown in FIG. 2A, a top-gate organic transistor 1A according to this embodiment includes a source electrode 20a and a drain electrode 20b spaced apart from each other on the substrate 500, an organic semiconductor film 30 provided to contact the source electrode 20a and the drain electrode 20b, a second gate dielectric film 40b provided to cover the organic semiconductor film 30, a first gate dielectric film 40a provided between a gate electrode 50 and the second gate dielectric films 40b, and a protective film 60 provided to cover the gate electrode 50 and the first gate dielectric film 40a.

The configuration of each component will be explained hereinafter.

The substrate 500 supports each layer (each component) of the organic transistor 1A (active-matrix device 300).

As the substrate 500, for example, a glass substrate, a plastic substrate (resin substrate) made of polycarbonate (PC), polyethylene terephthalate (PET), polyethylene naphthalate (PEN), polyether sulphone (PES), an aromatic polyester (liquid crystal polymer), polyimide (PI), etc., a quartz substrate, a silicon substrate, a metal substrate, a gallium arsenide substrate, or the like is usable.

In order for the organic transistor 1A to have flexibility, the substrate 500 is a plastic substrate, a thin metal substrate (with a relatively small thickness), or a thin glass substrate.

On the substrate 500, the source electrode 20a and the drain electrode 20b are provided with a predetermined space therebetween.

Examples for materials for the source electrode 20a and the drain electrode 20b include metal materials such as Pd, Pt, Au, W, Ta, Mo, Al, Cr, Ti, Cu, and alloys thereof; carbon materials such as carbon black, carbon nanotubes, and fullerens; and electrically conductive polymeric materials such as polyacethylene, polypyrrole, poly(3,4-ethylenedioxythiophene) (PEDOT) and like polythiophenes, polyaniline, poly(p-phenylene), poly(p-phenylenevinylene), polyfluorene, polycarbazole, polysilane, derivatives thereof, and mixtures thereof. These may be used singly or in combination of two or more kinds. As a mixed electrically conductive polymeric material, for example, poly(3,4-ethylenedioxythiophene) (PEDOT)/poly(styrene sulfonate) (PSS) is mentioned.

Among these, the source electrode 20a and the drain electrode 20b are preferably formed of a material based on Au, Ag, Cu, Pt, or an alloy thereof. These materials have a relatively high work function. Therefore, in the case where the organic semiconductor film 30 is a p-type, by forming the source electrode 20a using such a material, the efficiency of hole (carrier) injection into the organic semiconductor film 30 can be improved.

The average thicknesses of the source electrode 20a and the drain electrode 20b are not limited, and are each preferably about 10 nm to about 1000 nm, and more preferably about 50 nm to about 500 nm.

The distance between the source electrode 20a and the drain electrode 20b, i.e., the channel length L shown in FIGS. 2A and 2B, is not limited, and is preferably about 0.05 µm to about 100 µm, and more preferably about 0.5 µm to about 50 µm. A channel length L within such a range enables the improvement of the properties of the organic transistor 1A (in particular, an increase in the ON current value).

The length of the source electrode 20a and the drain electrode 20b, i.e., the channel width W shown in FIG. 2B, is not limited, and is preferably about 0.01 mm to about 50 mm, and more preferably about 0.05 mm to about 1 mm. A channel width W within such a range enables the reduction of parasitic capacitance, thereby preventing the degradation of the properties of the organic transistor 1A. In addition, an increase in the size of the organic transistor 1A can also be prevented. In other words, a smaller organic transistor 1A can be provided.

The organic semiconductor film 30 is provided to contact the source electrode 20a and the drain electrode 20b. Examples of materials for the organic semiconductor film 30 include polymeric organic semiconductor materials such as poly(3-alkylthiophene), poly(3-hexylthiophene) (P3HT), poly(3-octylthiophene), poly(2,5-thienylenevinylene) (PTV), poly(p-phenylenevinylene) (PPV), poly(2-methoxy-5-(2'-ethylhexoxy)-p-phenylenevinylene) (MEH-PPV), poly (9,9-dioctylfluorene) (PFO), poly(9,9-dioctylfluorene-co-bis-N,N'-(4-methoxyphenyl)-bis-N,N'-phenyl-1,4-phenylenediamine) (PFMO), poly(9,9-dioctylfluorene-co-benzothiadiazole) (BT), fluorene-triarylamine copolymers, triarylamine-based polymers, fluorene-bithiophene copolymers (F8T2), and polyarylamine (PAA); acerae molecular materials such as fullerens, metal phthalocyanine and derivatives thereof, anthracene, tetracene, pentacene, and hexacene; and low molecular organic semiconductor materials such as quaterthiophene (4T), sexithiophene (6T), octithiophene (8T), dihexylquaterthiophene (DH4T), dihexylsexithiophene (DH6T), and like a-oligothiophenes. These may be used singly or in combination of two or more kinds.

Among these, those based on low molecular organic semiconductor materials, such as pentacene and like crystalline, low molecular organic semiconductor materials, generally have excellent carrier transportability, while those based on polymeric organic semiconductor materials, such as P3HT and like materials, generally have higher solubility in a solvent than pentacene and like low molecular materials. These will thus be suitable for use in a liquid-phase process. A liquid-phase process as used herein is a method in which a film formation material is dissolved or dispersed to give a fluid substance, and then the fluid substance is applied by spin coating, dipping, or droplet discharging (ink-jet printing) to form a film.

Further, the organic semiconductor film 30 based on a polymeric organic semiconductor material generally has excellent flexibility, and is suitable for application to a switching element that forms a pixel circuit of a flexible display, its peripheral circuit, etc.

The average thickness of the organic semiconductor film 30 is not limited, and is preferably about 0.1 nm to about 500 nm, and more preferably about 1 nm to about 200 nm. In terms of the application of a liquid-phase process, an average thickness of about 10 nm to about 100 nm is still more preferable.

The organic semiconductor film 30 may be formed selectively in the region between the source electrode 20a and the drain electrode 20b (channel region), and may also be provided to almost entirely cover the source electrode 20a and the drain electrode 20b.

The second gate dielectric film 40b is provided to contact the organic semiconductor film 30 and to cover the organic semiconductor film 30, the source electrode 20a, and the drain electrode 20b. Further, the first gate dielectric film 40a is provided to contact the second gate dielectric film 40b and to cover the second gate dielectric film 40b. The first gate dielectric film 40a and the second gate dielectric film 40b form a gate dielectric film 40.

The first gate dielectric film 40a and the second gate dielectric film 40b (i.e., the gate dielectric film 40) insulate the below-mentioned gate electrode 50 from the source electrode 20a and the drain electrode 20b.

Examples of materials for the first gate dielectric film 40a and the second gate dielectric film 40b include organic insulating materials such as polyimide, polyamidoimide, and like imide resins, polymethyl methacrylate (PMMA) and like acrylic resins, polytetrafluoroethylene (PTFE) and like fluororesins, poly-p-xylylene and like parylene resins, polyvinyl alcohol and like polyvinyl alcohol resins, polyvinylphenol, novolak resin, and like phenolic resins, polymethyl silsesquioxane, polyphenyl silsesquioxane, and like silsesquioxane resins, and polyethylene, polypropylene, polyisobutylene, polystyrene, polybutene, tetratetracontane, and like olefin resins; and inorganic insulating materials such as SiO (silicon oxide) and SiN (silicon nitride). Organic insulating materials (organic compounds) are less likely to put extra stress, such as heat, on the organic semiconductor film 30 during the formation thereof, and are preferable in this respect.

The top-gate organic transistor 1A according to this embodiment is characterized in that the first gate dielectric film 40a has a fluorine-atom-containing organic compound, and that the second gate dielectric film 40b has a hydrocarbon compound containing oxide and hydrogen atoms.

In particular, in order to ensure operation stability as a transistor, the second gate dielectric film 40b in contact with the organic semiconductor film 30 is required to have a stable solid phase at least at ordinary temperature, and the carbon number of the hydrocarbon compound therein is preferably 30 or more. A carbon number of 30 or more leads to a melting point of about 65° C. or more. In addition, in order to effectively suppress the gate leakage current, a hydrocarbon compound having a specific resistance of $10^8$ Ωcm or more at ordinary temperature is preferably selected.

The average thickness of the first gate dielectric film 40a is not limited, and is preferably about 10 nm to about 5000 nm, and more preferably about 100 nm to about 2000 nm. The average thickness of the second gate dielectric film 40b formed of a hydrocarbon compound containing carbon and hydrogen atoms is most preferably 5 nm to 500 nm. By providing the first gate dielectric film 40a and the second gate dielectric film 40b with an average thickness within such a range (i.e., the first gate dielectric film 40a being thicker than the second gate dielectric film 40b), the source electrode 20a and the drain electrode 20b can be reliably insulated from the gate electrode 50, and, at the same time, the operating voltage of the organic transistor 1A can be reduced.

In a predetermined position on the first gate dielectric film 40a, i.e., a position corresponding to the region between the source electrode 20a and the drain electrode 20b, a gate electrode 50 for applying an electric field to the organic semiconductor film 30 is provided.

Examples of materials for the gate electrode 50 include metal materials such as Pd, Pt, Au, W, Ta, Mo, Al, Cr, Ti, Cu, and alloys thereof, carbon materials such as carbon black, carbon nanotubes, and fullerens, conductive polymeric materials such as polyacethylene, polypyrrole, poly(3,4-ethylenedioxythiophene) (PEDOT) and like polythiophenes, polyaniline, poly(p-phenylene), poly(p-phenylenevinylene), polyfluorene, polycarbazole, polysilane, derivatives thereof, and mixtures thereof. These may be used singly or in combination of two or more kinds. As a mixed conductive polymeric material, for example, poly(3,4-ethylenedioxythiophene) (PEDOT)/poly(styrene sulfonate) (PBS) is mentioned.

The average thickness of the gate electrode 50 is not limited, and is preferably about 1 nm to about 1000 nm, and more preferably about 1 nm to about 200 nm.

A protective film 60 is provided to cover the above-mentioned films. The protective film 60 has the functions of, for example, preventing the degradation of the properties of the organic transistor 1A due to the entry of moisture into the organic semiconductor film 30 and also preventing a short circuit between adjacent organic transistors 1A due to contact of a foreign substance with the gate electrodes 50.

Examples of materials for the protective film include organic insulating materials such as polystyrene, polyimide, polyamidoimide, polyvinyl phenylene, polycarbonate (PC), polymethyl methacrylate (PMMA), and like acrylic resins, polytetrafluoroethylene (PTFE) and like fluororesins, poly-p-xylylene and like parylene resins, polyvinyl alcohol and like polyvinyl alcohol resins, polyvinylphenol, novolak resin, and like phenolic resins, polymethyl silsesquioxane, polyphenyl silsesquioxane, and like silsesquioxane resins, and polyethylene, polypropylene, polyisobutylene, polybutene, tetratetracontane, and like olefin resins; and inorganic insulating materials such as SiO and SiN.

The average thickness of the protective film 60 is not limited, and is preferably about 0.05 μm to about 20 μm, and more preferably about 0.1 μm to about 5 μm.

The protective film 60 is optional, and may be omitted.

Operation of Organic Transistor

In such an organic transistor 1A, with a voltage being applied between the source electrode 20a and the drain electrode 20b, a gate voltage is applied to the gate electrode 50 in such a manner that in the organic semiconductor film 30, carriers (holes or electrons) are excited near the interface between the organic semiconductor film 30 and the second gate dielectric film 40b, thereby forming a channel (carrier channel). As a result, due to the movement of the carriers in the channel region, current flows between the source electrode 20a and the drain electrode 20b.

In contrast, when a gate voltage is applied to the gate electrode 50 in such a manner that in the organic semiconductor film 30, carriers are not excited near the interface between the organic semiconductor film 30 and the second gate dielectric film 40b (carriers are depleted), because few carriers exist in the organic semiconductor film 30, the application of a voltage between the source electrode 20a and the drain electrode 20b causes only a small current flow.

Here, when at least either the first gate dielectric film 40a or the second gate dielectric film 40b has a hydrocarbon compound containing carbon and hydrogen atoms or a fluorine-containing compound containing fluorine atoms, the organic transistor 1A can be provided with the following characteristics, for example. Specifically, for example, because a fluorine-containing compound has low hygroscopicity, use of such a compound for the gate dielectric film 40 leads to an organic transistor 1A that is less prone to property degradation over time and has sufficient insulation properties, reducing the gate leakage current due to atmospheric moisture. Further, for example, because a hydrocarbon compound does not have a large polar group, use of such a compound for the gate dielectric film 40 inhibits the formation of a trap level, which is a possible factor to hinder the movement of carriers, in the channel portion of the organic semiconductor film 30. Accordingly, an organic transistor LA with high ON current and a high ON/OFF ratio can be obtained.

In this embodiment, the gate dielectric film 40 has a laminated structure including the first gate dielectric film 40a and the second gate dielectric film 40b, whereby the dielectric films can each be provided with various functions.

Specifically, for example, in the organic transistor 1A, in the case where the first gate dielectric film 40a has a fluorine-containing compound and the second gate dielectric film 40b has a hydrocarbon compound, the first gate dielectric film 40a serves to effectively prevent property degradation due to moisture absorption, particularly the shift (change) in the threshold voltage (Vth) accompanying the ion current generation, an increase in the gate leakage current, dielectric breakdown, etc. At the same time, use of the second gate dielectric film 40b at the interface of the organic semiconductor film 30 leads to the formation of an excellent interface with a reduced number of trap levels. Therefore, the organic transistor 1A can be provided with high ON current and a high ON/OFF ratio.

Further, by providing the first gate dielectric film 40a with a thickness larger than that of the second gate dielectric film 40b, the insulation by the first gate dielectric film 40a can be more reliably ensured.

Further, by providing the second gate dielectric film 40b with an average thickness within a range of 5 nm to 500 nm, carriers can be generated sufficiently in the channel portion even at a low gate voltage, and the channel portion can also be reliably prevented from becoming electrically conductive. Accordingly, the organic transistor 1A can be provided with high ON current and a high ON/OFF ratio. This indicates that the operating voltage of the organic transistor 1A can be reduced. When the average thickness of the second gate dielectric film 40b is below this range, it is difficult to reliably form the second gate dielectric film 40b. When the average thickness is above this range, the resulting second gate dielectric film 40b is too thick, whereby a higher gate voltage is required to form a channel in the organic semiconductor film 30 or prevent the channel portion from becoming electrically conductive. That is, the operating voltage of the organic transistor 1A is possibly increased.

Method for Producing Active-Matrix Device

Hereinafter, a method for producing the active-matrix device 300 will be explained. Mainly, a method for producing the organic transistor 1A will be explained below.

1. Formation of Source Electrode and Drain Electrode (See FIG. 4A)

First, a substrate 500 is prepared. On the substrate 500, a source electrode 20a and a drain electrode 20b are formed with a predetermined distance therebetween.

These electrodes are formed in the following manner. First, a metal film (metal layer) is formed on the substrate 500. The metal film (metal layer) can be formed, for example, by chemical vapor deposition (CVD) such as plasma CVD, heat CVD, or laser CVD; dry plating such as vacuum deposition, sputtering (low-temperature sputtering), or ion plating; wet plating such as electrolytic plating, immersion plating, or electroless deposition; thermal spraying; a sol-gel process; MOD; metal foil bonding; etc.

A resist material is applied onto the metal film and then cured to form a resist layer having a shape conforming to the shape of the source electrode 20a and the drain electrode 20b to be formed. The resist layer serves as a mask to remove undesired portions of the metal film. For the removal of the metal film, for example, physical etching methods such as plasma etching, reactive ion etching, beam etching, and photo-assisted etching, chemical etching methods such as wet etching, and the like may be used singly or in combination of two or more kinds.

Subsequently, the resist layer is removed to give the source electrode 20a and the drain electrode 20b.

The source electrode 20a and the drain electrode 20b may also be formed, for example, by a method in which an electrically conductive material containing electrically conductive particles is dispensed onto the substrate 500 to form a liquid coating, and the liquid coating is then subjected to a post treatment (e.g., heating, vacuum drying, UV irradiation, ultrasound application, etc.) as required.

Examples of methods for dispensing the electrically conductive material include spin coating, casting, micro-gravure coating, gravure coating, bar coating, roll coating, wire-bar coating, dip coating, spray coating, screen printing, flexographic printing, offset printing, ink-jet printing, and microcontact printing. These methods may be used singly or in combination of two or more kinds.

At this time, data lines 301 (not illustrated) and pixel electrodes 303 (not illustrated) are also formed.

2. Formation of Organic Semiconductor Film (See FIG. 4B)

Next, an organic semiconductor film 30 is formed to contact the source electrode 20a and the drain electrode 20b.

The organic semiconductor film 30 can be formed, for example, by a method in which a solution containing an organic semiconductor material or its precursor is dispensed to a predetermined region on the substrate 500 including the region between the source electrode 20a and the drain electrode 20b, thereby forming a liquid coating, and the liquid coating is then subjected to a post treatment (e.g., heating, vacuum drying, UV irradiation, ultrasound application, etc.) as required.

The method for dispensing the solution may be selected from the methods for dispensing an electrically conductive material mentioned above in 1.

3. Formation of Second Gate Dielectric Film (See FIG. 4C)

Next, a second gate dielectric film 40b is formed to cover the source electrode 20a, the drain electrode 20b, and the organic semiconductor film 30.

The second gate dielectric film 40b can be formed, for example, by a gas-phase process such as chemical vapor deposition (CVD), such as plasma CVD, heat CVD, and laser CVD, or vacuum deposition. The second gate dielectric film 40b may also be formed by a method in which a solvent solution of an insulating polymer for the second gate dielectric film 40b is dispensed onto the substrate 500 so as to cover the source electrode 20a, the drain electrode 20b, and the organic semiconductor film 30, followed by desolvation (a liquid-phase process). In a gas-phase process, the film formation temperature is about 100° C. In contrast, in a liquid-phase process, although it depends on the kind of solvent, the drying temperature can be about 60° C. Therefore, use of a liquid-phase process prevents unwanted heating of the organic semiconductor film 30, and this allows the desired prevention of the degradation of the properties of the organic semiconductor film 30 and, eventually, the properties of the organic transistor 1A.

Examples of solvents for use in the preparation of the solution include various organic solvents such as methyl ethyl ketone (MEK), acetone, diethyl ketone, methyl isobutyl ketone (MIBK), methyl isopropyl ketone (MIPK), cyclohexanone, and like ketone solvents; methanol, ethanol, isopropanol, ethylene glycol, diethylene glycol (DEG), glycerin, and like alcoholic solvents; diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), diethylene glycol ethyl ether (Carbitol), and like ethereal solvents; methyl acetate, ethyl acetate, butyl acetate, ethyl formate, and like ester solvents; methyl cellosolve, ethyl cellosolve, phenyl cellosolve, and like cellosolve solvents; hexane, pentane, heptane, cyclohexane, and like aliphatic hydrocarbon solvents; toluene, xylene, benzene, trimethyl benzene, tetramethyl benzene, and like aromatic hydrocarbon solvents; pyridine, pyrazine, furan, pyrrole, thiophene, methylpyrrolidone, and like aromatic heterocyclic solvents; N,N-dimethylformamide (DMF), N,N-dimethylacetamide (DMA), and like amide solvents; dichloromethane, chloroform, 1,2-dichloroethane, and like halogenated solvents; dimethyl sulfoxide (DMSO), sulfolane, and like sulfur solvents; acetonitrile, propionitrile, acrylonitrile, and like nitrile solvents; and formic acid, acetic acid, trichloroacetic acid, trifluoroacetic acid, and like organic acid solvents. Mixed solvents thereof are also usable. In this case, preferred solvents for the preparation of the solution are those that do not cause the dissolution or swelling of the organic semiconductor film 30.

The method for dispensing the solution may be selected from the methods for dispensing an electrically conductive material mentioned above in 1.

4. Formation of First Gate Dielectric Film (See FIG. 4D)

Next, a first gate dielectric film 40a is formed to cover the second gate dielectric film 40b.

As in the formation of the second gate dielectric film 40b, the first gate dielectric film 40a can be formed by a gas-phase process or a liquid-phase process.

In the case where a liquid-phase process is applied, a solvent used for the solution preparation is preferably one that does not cause the dissolution or swelling of the second dielectric film 40b.

5. Formation of Gate Electrode (See FIG. 4E)

Next, on the first gate dielectric film 40a, a gate electrode 50 is formed to correspond to the region between the source electrode 20a and the drain electrode 20b.

The gate electrode 50 can be formed in the same manner as in the formation of the source electrode 20a and the drain electrode 20b. It is particularly preferable to form the gate electrode 50 by a liquid-phase process using as an electrode-forming material (electrically conductive material), for example, a dispersion of PEDOT/PSS (electrically conductive polymer), a dispersion containing metal particles, such as a silver colloid or a copper colloid, etc.

In such a liquid-phase process, for example, by dispensing the electrode-forming material onto the first gate dielectric film 40a by ink-jet printing, a gate electrode 50 with high dimensional accuracy can be readily formed.

Here, such an electrode-forming material is prepared using an aqueous dispersion medium, which often contains various ions in a dissolved state eluted from impurities or metal particles. However, for example, by forming the first gate dielectric film 40a using as a chief material the above-mentioned insulating polymer having high moisture resistance (low hygroscopicity), the diffusion of ions into the first gate dielectric film 40a can be prevented, making it possible to maintain the excellent interface formed by the second gate dielectric film 40b and the organic semiconductor film 30. That is, inconveniences resulting from the diffusion of ions into the first gate dielectric film 40a (e.g., ion current generation, dielectric breakdown, etc.) can be prevented. Therefore, the excellent properties of the organic transistor 1A owing to the formation of the excellent interface can be maintained for a long period of time.

At this time, scanning lines 302 (not illustrated) are formed.

Although the scanning lines 302 are formed independently from the gate electrode 50 in this embodiment, it is also possible to successively form the gate electrodes 50 of adjacent organic transistors 1A to give the scanning lines 302.

6. Formation of Protective Film (See FIG. 4F)

Next, on the first gate dielectric film 40a, a protective film 60 is formed to cover the gate electrode 50.

The protective film 60 can be formed in the same manner as in the formation of the first gate dielectric film 40a and the second gate dielectric film 40b.

Electro-Optical Device

Next, as an example of an electro-optical device according to an embodiment of the invention, an embodiment of an electrophoretic display device having the above-mentioned active-matrix device incorporated therein will be explained.

Figure 5:
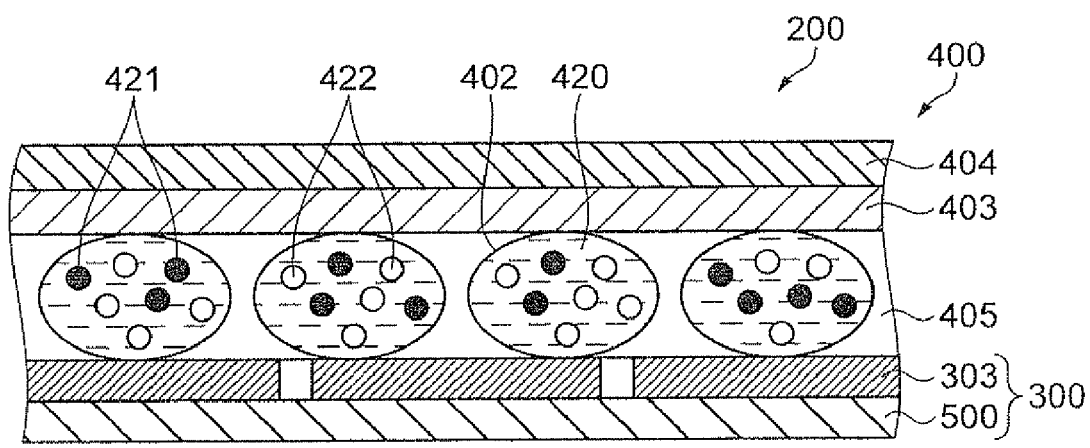
FIG. 5 is a longitudinal sectional view of an embodiment of an electrophoretic display device.

FIG. 5 is a longitudinal sectional view of an embodiment of an electrophoretic display device. In the following explanation, the upper side of FIG. 5 is expressed as "up", and the lower side as "down."

An electrophoretic display device 200 shown in FIG. 5 has the above-mentioned active-matrix device 300 and an electrophoretic display 400 provided on the active-matrix device 300.

The electrophoretic display 400 includes a transparent substrate 404 provided with a transparent electrode (common electrode) 403 and microcapsules 402 fixed to the transparent electrode 403 with a binder material 405.

The active-matrix device 300 and the electrophoretic display 400 are bonded in such a manner that the microcapsules 402 are in contact with pixel electrodes 303.

Each microcapsule 402 is filled with an electrophoretic dispersion 420 having two or more kinds of electrophoretic particles with different properties. In this embodiment, the encapsulated electrophoretic dispersion 420 has two kinds of electrophoretic particles 421 and 422 with different electric charges and colors (hues).

In such an electrophoretic display device 200, in response to the application of a select signal (select voltage) to one or more scanning lines 302, the organic transistors 1 electrically connected to such scanning lines 302 to which the select signal (select voltage) was supplied are turned ON.

As a result, a data line 301 and a pixel electrode 303 electrically connected to such an organic transistor 1 are brought into a substantially conducting state. If the data lines 301 are provided with a desired data (voltage) at this time, then the data (voltage) is supplied to the respective pixel electrodes 303.

Accordingly, an electric field is generated between the pixel electrodes 303 and the transparent electrode 403. The electrophoretic particles 421 and 422 are then electrophoresed toward either electrode depending on the strength or direction of the electric field, the properties of the electrophoretic particles 421 and 422, and the like.

Meanwhile, from this state, when the supply of the select signal (select voltage) to the scanning line(s) 302 is stopped, the organic transistors 1 are turned OFF, and the data line 301 and the pixel electrode 303 electrically connected to such an organic transistor 1 are brought into a non-conducting state.

Therefore, by suitably combining the supply of a select signal to the scanning lines 302 with the stoppage of the supply or the supply of data to the data lines 301 with the stoppage of the supply, a desired image (information) can be displayed on the display-surface side (transparent-substrate-404 side) of the electrophoretic display device 200.

In particular, in the electrophoretic display device 200 according to this embodiment, because of the color difference between the electrophoretic particles 421 and 422, a multiple-tone image can be displayed.

Further, in the electrophoretic display device 200 according to this embodiment, by the inclusion of the active-matrix device 300, the organic transistors 1 connected to a specific scanning line 302 can be selectively turned ON or OFF. Therefore, crosstalk problems are hardly caused, and the circuit operation speed can also be increased. High-quality images (information) can thus be obtained.

Further, the electrophoretic display device 200 according to this embodiment operates at low driving voltage, and, therefore, the power consumption can be reduced.

Such an electrophoretic display device 200 may be an electro-optical device including microcapsules as an electro-optical material on the pixel electrodes 303 electrically connected to the organic transistors 1, and may also be, although not illustrated, a partitioned electro-optical device having a plurality of cells, each cell being filled with an electrophoretic dispersion containing electrophoretic particles. The invention is not limited to the application to such an electrophoretic display device 200, and may also be applied to an organic electroluminescence device or the like as an electro-optical device, for example. In such a case, as the electro-optical material, an appropriate material selected form an hole injection layer, a hole transport layer, an organic light-emitting material, an electron transport layer, an electron injection layer, and the like is placed on the pixel electrodes 303.

Electronic Equipment

Such an electrophoretic display device 200 can be incorporated into various kinds of electronic equipment. Hereinafter, some embodiments of electronic equipment having the electrophoretic display device 200 will be explained.

Electronic Paper

First, an embodiment where the electrophoretic display device 200 according to the above embodiment is applied to electronic paper as electronic equipment will be explained.

Figure 6:
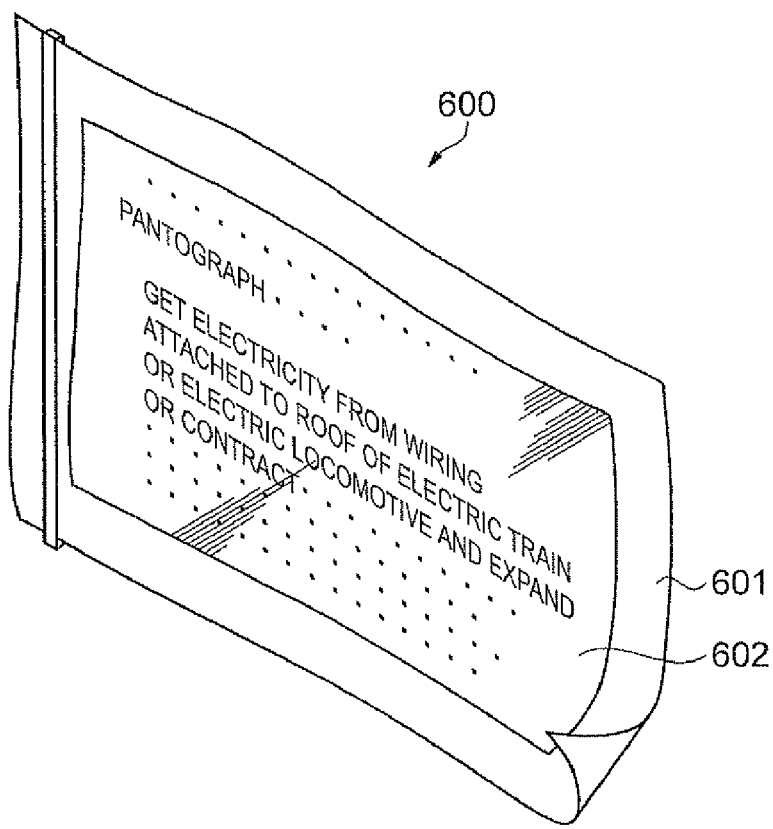
FIG. 6 is a perspective view showing an embodiment where electronic equipment according to an aspect of the invention is applied to electronic paper.

FIG. 6 is a perspective view of an embodiment of electronic paper as the electronic equipment of this embodiment.

The electronic paper 600 shown in the figure includes a body 601 and a display unit 602. The body is formed of a rewritable sheet having paper-like texture and flexibility.

In such electronic paper 600, the display unit 602 is formed of the above-mentioned electrophoretic display 200.

Display

Next, an embodiment where the above-mentioned electronic paper is applied to a display will be explained.

Figure 7A:
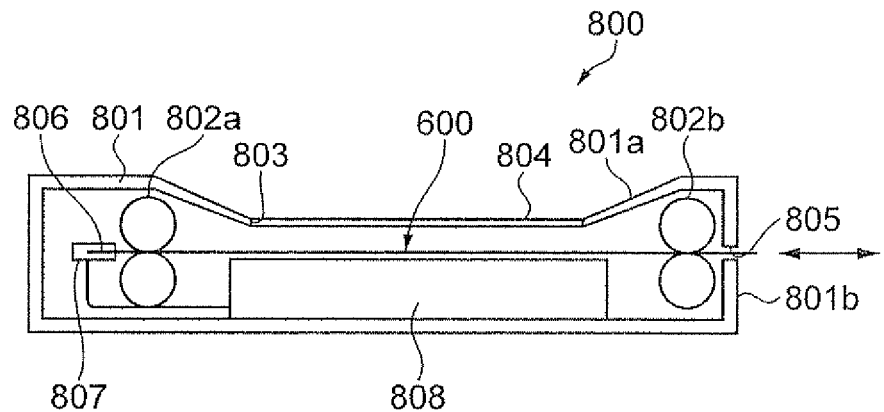
FIGS. 7A and 7B show an embodiment where electronic equipment according to an aspect of the invention is applied to a display.
Figure 7B:
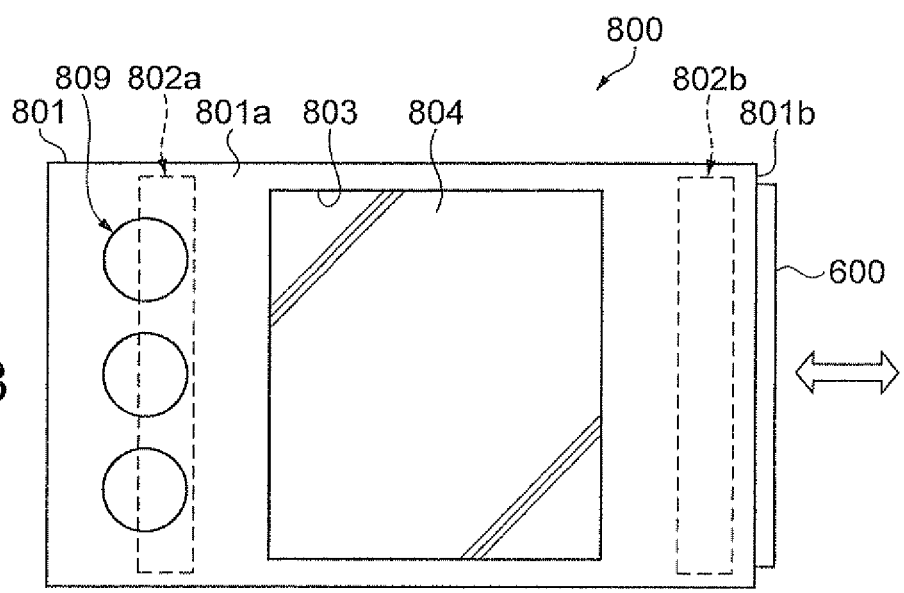

FIGS. 7A and 7B show an embodiment where the electronic paper is applied to a display. FIG. 7A is a sectional view, and FIG. 7B is a plan view.

A display 800 shown in the figure includes a body portion 801 and the electronic paper 600 of the above embodiment. The electronic paper 600 is detachably attached to the body portion 801.

The body portion 801 has, in a side portion 801b thereof (the right-hand side in FIG. 7 A), an insertion opening 805 that allows the insertion of the electronic paper 600 thereinto. The body portion 801 internally has two sets of conveyance roller pairs 802a and 802b. The electronic paper 600 is inserted into the body portion 801 through the insertion opening 805, whereby the electronic paper 600 held between the conveyance roller pairs 802a and 802b is installed in the body portion 801.

A rectangular aperture 803 is formed in the display-surface-801a side of the body portion 801 (the near side in FIG. 7B), and a clear glass plate 804 is fitted into the aperture 803. Accordingly, the electronic paper 600 installed in the body portion 801 is visible from the outside of the body portion 801. That is, in the display 800, the electronic paper 600 installed in the body portion 801 is made visible through the clear glass plate 804, and the display surface is thus configured.

A terminal portion 806 is provided at the end of insertion of the electronic paper 600 (the left-hand side in FIG. 7A). Inside the body portion 801 is provided a socket 807. With the electronic paper 600 being installed in the body portion 801, the terminal portion 806 is connected to the socket 807. To the socket 807, a controller 808 and a final controlling element 809 are electrically connected.

In such a display 800, the electronic paper 600 is detachably installed in the body portion 801, and thus is available for portable use in the state of being detached from the body portion 801.

Further, in such a display 800, the electronic paper 600 is formed of the above-mentioned electrophoretic display 200.

The application of the electronic equipment according to the invention is not limited to the above examples. For example, the electronic equipment may also be applied to a TV, a viewfinder-type or monitor-direct-view-type videotape recorder, a monitor-direct-view-type video disc recorder, a car navigation system, a pager, an electronic notebook, a calculator, electronic newspaper, a word processor, a personal computer, a workstation, a TV phone, a POS terminal, equipment provided with a touch panel, etc. The electrophoretic display device 200 is applicable as the display of such electronic equipment.

The organic transistor 1A and a method for producing the same according to some embodiments have been explained above, but the invention is not limited thereto. FIGS. 3A and 3B show the configuration of an organic transistor with a bottom gate-structure for use in the active-matrix device shown in FIG. 1 (A: longitudinal sectional view, B: plan view). Components having the same configuration as in the organic transistor 1A are indicated by the same reference numerals, and a detailed explanation will be omitted.

The above embodiment describes the case where the organic transistor 1 is the organic transistor 1A having a top-gate structure. However, the organic transistor 1 may also be an organic transistor 1B having a bottom-gate structure as shown in FIGS. 3A and 3B, in which the gate electrode 50 is closer to the substrate 500 than are the source electrode 20a and the drain electrode 20b. In the bottom gate structure, a gate electrode 50 is formed on a substrate 500; a first gate dielectric film 40a is formed on the gate electrode 50; a second gate dielectric film 40b having a hydrocarbon compound containing carbon and hydrogen atoms is formed on the first gate dielectric film 40a; a source electrode 20a and a drain electrode 20a are formed with a space therebetween on the second gate dielectric film 40b; an organic semiconductor film 30 is formed in a position between the source electrode 20a and the drain electrode 20b, the position corresponding to the gate electrode 50; and a protective film 60 is formed to cover the organic semiconductor film 30.

The organic semiconductor film 30 is provided on the second gate dielectric film 40b having formed thereon the source electrode 20a and the drain electrode 20b, and thus is free from the influence of heat accompanying the formation of the first gate dielectric film 40a. Therefore, in addition to the above-mentioned fluorine-atom-containing organic compounds, inorganic insulating materials (inorganic compounds), such as SiO and SiN, may also be used to form the first gate dielectric film 40a.

The following explains more specific examples and comparative examples of the organic transistor 1, together with results of evaluation of the electrical properties thereof.

Production of Organic Transistor and Electrical Properties

Organic transistors of Examples 1 to 4 and Comparative Examples 1 to 5 were produced as shown in Table 1 of FIG. 8. For each example, 200 samples were prepared. FIG. 8 is a table showing the configuration of organic transistors produced in the Examples and Comparative Examples, together with the results of evaluation of their electrical properties.

Example 1

First, a glass substrate (manufactured by NIPPON ELECTRIC GLASS, "OA-10") was prepared. The glass substrate was washed with acetone and then with pure water, and dried.

Next, a film of gold was formed on the glass substrate by deposition, and then a resist layer was formed by photolithography. Using the resist layer as a mask, the thin film of gold was etched to give a source electrode and a drain electrode having an average thickness of 100 nm, a channel length (L) of 10 μm, and a channel width (W) of 1 mm.

Next, a toluene solution of poly(3-hexylthiophene-2,4-diyl) (P3HT) prepared to a concentration of 1 wt % was applied by ink-jet printing onto the glass substrate having formed thereon the source electrode and the drain electrode, and then dried at 100° C. for 10 minutes. An organic semiconductor film having an average thickness of 50 nm was thus obtained.

Next, a film of tetratetracontane ($C_{44}H_{90}$) was formed by deposition to cover the organic semiconductor film, the source electrode, and the drain electrode to give a second gate dielectric film having an average thickness of 50 nm. In Table 1, the abbreviation "TTC" is given to the cases where tetratetracontane was used.

Next, "CYTOP®" (manufactured by ASAHI GLASS, fluorine-based polymer) was applied by spin coating to cover the second gate dielectric film, and then dried at 80° C. for 1 hour. A first gate dielectric film having an average thickness of 500 nm was thus obtained.

Next, on the first gate dielectric film, an aqueous dispersion of Ag particles was applied by ink-jet printing to a region corresponding to the region between the source electrode and the drain electrode, and then dried at 80° C. for 10 minutes. A gate electrode having an average thickness of 100 nm and an average width of 30 m was thus obtained. In Table 1, the abbreviation "Ag-IJ (Ink Jet)" is given to the cases where the aqueous dispersion of Ag particles was used for the gate electrode formation.

Example 2

Organic transistors were produced in the same manner as in Example 1, except that the second gate dielectric film was formed using poly-1-butene in replace of tetratetracontane. In Table 1, the abbreviation "P1B" is given to the case where poly-1-butene was used.

Example 3

Organic transistors were produced in the same manner as in Example 1, except that the first gate dielectric film was formed using polymethyl methacrylate (PMMA) in place of CYTOP®.

Example 4

Organic transistors were produced in the same manner as in Example 1, except that the first gate dielectric film was formed using a compound A in place of CYTOP®. The production method for the compound A is as follows.
Method for Producing Compound A First, a 250-ml three-necked flask equipped with a dropping funnel and a calcium chloride ($CaCl_2$) drying tube was charged with 6.8 g of diphenyl ether, 26.8 g of aluminum chloride, and 60 ml of dry dichloroethane. A solution of 18.5 g of 2,3,4,5,6-pentafluorobenzoyl chloride and 15 ml of dry dichloroethane was slowly added dropwise into the flask with stirring. After the dropwise addition, the reaction mixture was stirred at room temperature overnight. A small quantity of water was added very slowly to the reaction mixture, followed by continuous stirring for 15 minutes. Next, the reaction mixture was poured into 250 ml of water and extracted with dichloromethane. The organic layer was collected, washed with water, dried over sodium sulfate, filtered, and evaporated. Treatment with activated carbon and recrystallization from methanol gave white crystals of 4,4'-bis(2,3,4,5,6-pentafluorobenzoyl)diphenyl ether (hereinafter referred to as "BPDE") (yield: 61.2%).

Meanwhile, a 100-ml, three-necked, round-bottomed flask equipped with a Dean-Stark trap, a capacitor, a magnetic stirrer, and a nitrogen inlet tube was charged with 1.2 g of 2,2-bis(4-hydroxyphenyl)-1,1,1,3,3,3-hexafluoropropane purified by recrystallization from toluene, 1.48 g of heavy potassium carbonate, 13 ml of dimethylacetamide, and 10 ml of toluene. The mixture was heated to 160° C. and refluxed for hours, and toluene was then distilled off. To the obtained mixture was added 2.0 g of the above-synthesized BPDE, and a polymerization reaction was carried out at 80° C. for 20 hours. After cooling, the obtained solution was poured into water containing 1% acetic acid with rapid stirring. The precipitated polymer was collected by filtration, washed with water, and then dried to give a compound A (yield: 91.0%).

The thus-obtained compound A is a fluorine-based organic polymer compound (carbocyclic hydrocarbon compound) of low polarity, in which fluorine atoms are evenly bonded to the carbocyclic side chains thereof. Such a compound A is characterized in that when, in particular, forming the first gate dielectric film 40a using a liquid-phase process, solvents for dissolving or dispersing the compound A can be selected from a wider range. The compound A can thus serve as a material for forming a first gate dielectric film 40a, which is suitable for use in a liquid-phase process such as ink-jet printing.

Comparative Example 1

Organic transistors were produced in the same manner as in Example 1, except that no second gate dielectric film was formed.

Comparative Example 2

Organic transistors were produced in the same manner as in Example 3, except that no second gate dielectric film was formed.

Comparative Example 3

Organic transistors were produced in the same manner as in Example 1, except that the first gate dielectric film was formed using poly-1-butene, and that no second gate dielectric film was formed.

Comparative Example 4

Organic transistors were produced in the same manner as in Example 1, except that the first gate dielectric film was formed using the compound A, and that no second gate dielectric film was formed.

Comparative Example 5

Organic transistors were produced in the same manner as in Example 1, except that the first gate dielectric film was formed using PMMA, and that the second gate dielectric film was formed using the compound A.

Table 1 in FIG. 8 shows the results of evaluation of the electrical properties of the organic transistors produced in the Examples and Comparative Examples.

First, as the method of electrical property evaluation, the transfer characteristics were measured in nitrogen ($N_2$) or in air (Air) (25° C., 60% RH).

From the obtained results, the mobility in each atmosphere, the ON/OFF ratio indicating the ratio between the ON current and the OFF current, and the threshold voltage (Vth) were calculated.

Table 1 shows the mobility, the ON/OFF ratio, and the difference between Vth in nitrogen and Vth in air ($\Delta$Vth=Vth (Air)−Vth ($N_2$)).

Further, dielectric breakdown testing was performed in air (25° C., 60% RH) for more than five times. For each example, the lowest value is shown in Table 1 as Vbd (breakdown voltage).

The values in Table 1 are each the average of data obtained from 200 organic transistors.

As shown in Table 1, with respect to mobility, all the organic transistors showed a decreasing tendency in nitrogen than in air. However, the decrease in mobility was smaller in the organic transistors of Examples 1 to 4 than in the organic transistors of the corresponding Comparative Examples 1 to 5.

It was also revealed the mobility in the organic transistors of Examples 1 to 4 was all greater than in the organic transistors of the corresponding Comparative Examples 1 to 5.

The same tendency was also observed with respect to ON/OFF ratio, and all the Examples showed a greater ON/OFF ratio as compared with the Comparative Examples.

It was also revealed the ΔVth values of the organic transistors of Examples 1 to 4 were all smaller than those of the organic transistors of Comparatives Examples 1 to 5.

Further, there was a tendency that the breakdown voltages in air of the organic transistors of Examples 1 to 4 are generally higher than those of the organic transistors of Comparative Examples 1 to 5. That is, organic transistors with high reliability were obtained.

In addition to the above embodiments, various alternative embodiments are possible. Hereinafter, alternative embodiments will be explained.

Alternative Embodiment 1

Figure 11A:
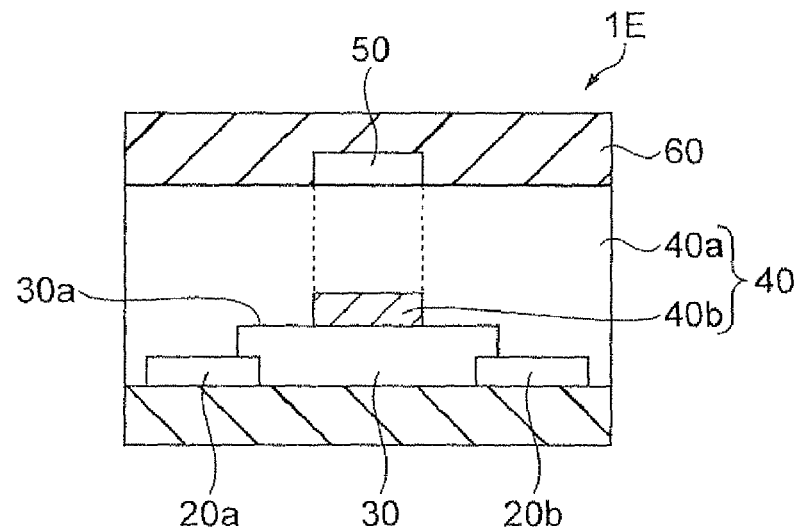
FIGS. 11A to 11C are schematic diagrams showing the structures of organic transistors according to some alternative embodiments.
Figure 11B:
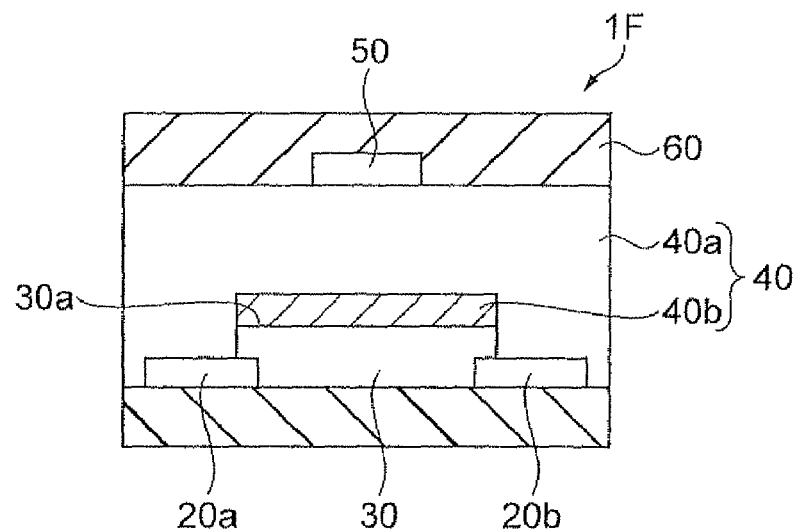
Figure 11C:
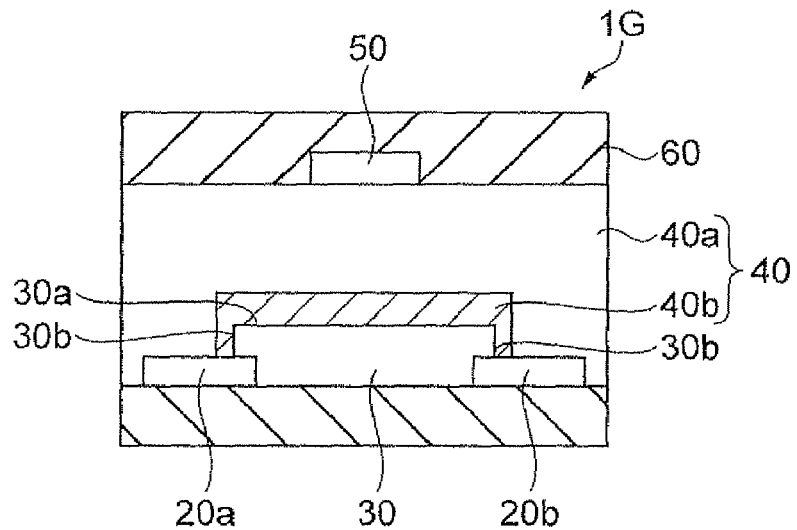

The invention is not limited to the structure of the organic transistor 1A of the above embodiment. FIGS. 9A and 9B and FIGS. 10A and 10B are schematic diagrams showing the configuration of organic transistors according to some alternative embodiments (plan view and sectional view). FIGS. 11A to 11C are schematic diagrams showing the structures of organic transistors according to other alternative embodiments. Components having the same configuration as in the organic transistor 1A will be indicated by the same reference numerals.

For example, when the organic semiconductor film 30 and the second gate dielectric film 40b are formed using a liquid-phase process, the planar outer shape thereof does not necessarily have to be rectangular defined by straight lines as shown in 2B. Like an organic transistor 1C of the alternative embodiment shown in FIG. 9A, the planar outer shape of the organic semiconductor film 30 may be uneven. Further, when a fluid substance containing the material for forming an organic semiconductor film 30 applied to cover the source electrode 20a and the drain electrode 20b is solidified, as shown in FIG. 9B, the sectional shape of the resulting organic semiconductor film 30 reflects the sectional shape of the applied fluid substance, so the top surface is arc-shaped. Therefore, after the organic semiconductor film 30 is formed, a fluid substance containing a material for forming a second gate dielectric film 40 can be applied also using a liquid-phase process such as spin coating to reliably cover the organic semiconductor film 30, the source electrode 20a, and the drain electrode 20b on the substrate 500.

Figure 9A:
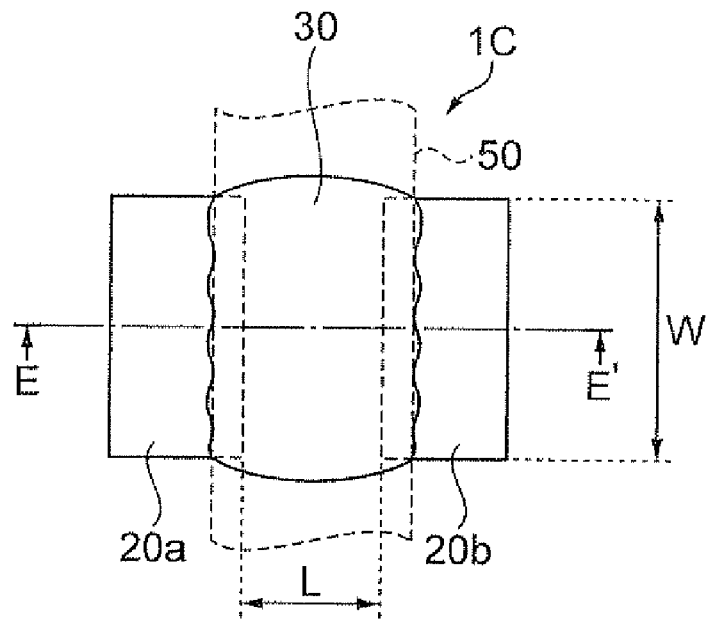
FIGS. 9A and 9B are schematic diagrams showing the configuration of an organic transistor according to an alternative embodiment (plan view and sectional view).
Figure 9B:
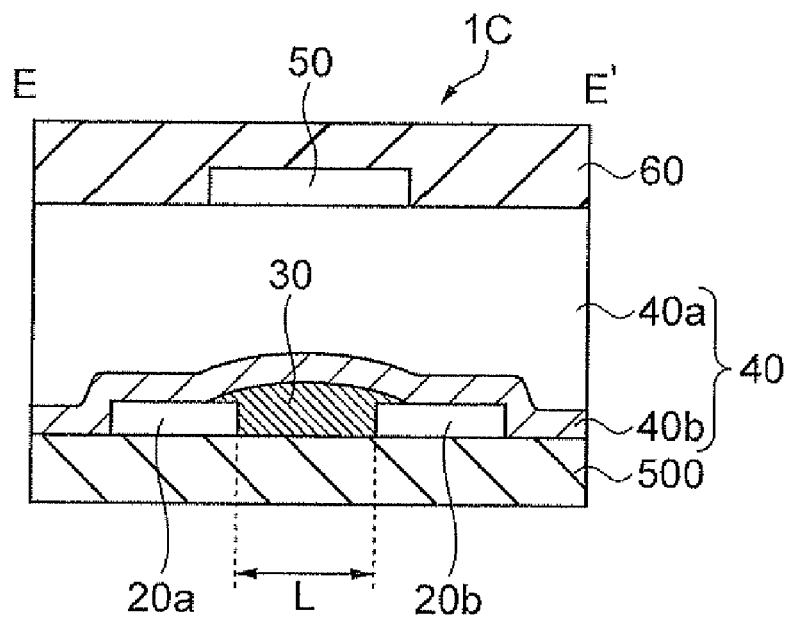
Figure 10A:
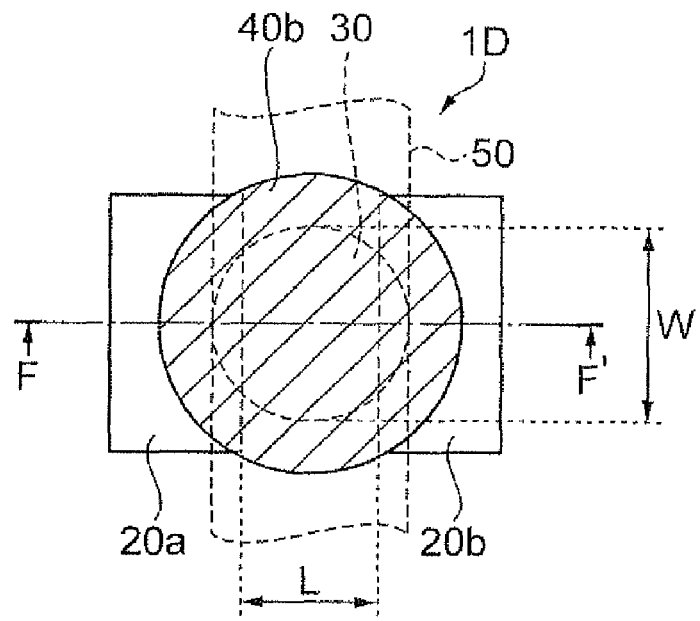
FIGS. 10A and 10B are schematic diagrams showing the configuration of an organic transistor according to an alternative embodiment (plan view and sectional view).
Figure 10B:
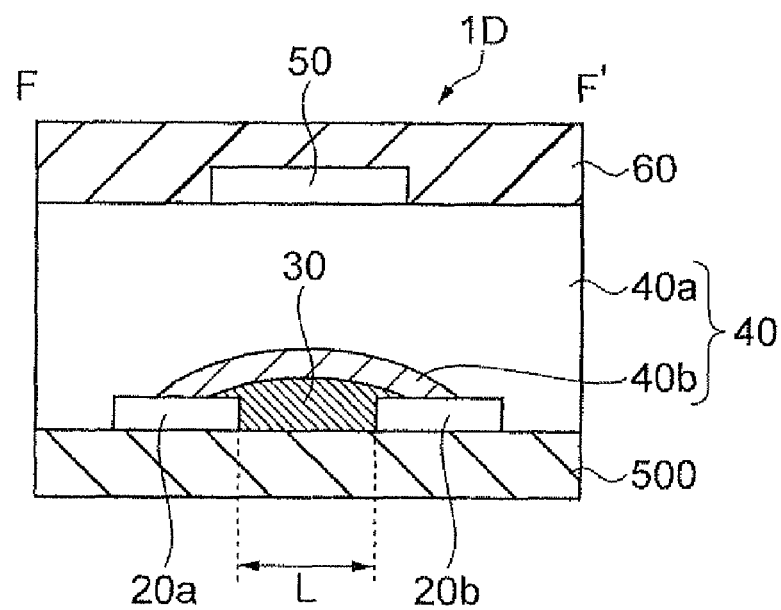

Using a liquid-phase process, the organic semiconductor film 30 does not have to be formed over the entire width of the source electrode 20a and the drain electrode 20b that are opposed to each other in a planar manner with the channel length (L) therebetween as shown in FIG. 9A. For example, like an organic transistor 1D of the alternative embodiment shown in FIGS. 10A and 10B, a fluid substance containing a material for forming an organic semiconductor film 30 is discharged in droplets by ink-jet printing between the source electrode 20a and the drain electrode 20b. After landing, the fluid substance is allowed to run to be approximately circular in plan view, and then solidified. Subsequently, in a manner to cover this, a fluid substance containing a material for forming a second gate dielectric film 40b is discharged also by ink-jet printing onto the organic semiconductor film 30, allowed to run, and solidified. Thus, by controlling the diameter of the fluid substance after landing, the length of the channel width (W) can be freely controlled.

Further, the organic semiconductor film 30 and the second gate dielectric film 40b may be formed not using a liquid-phase process. With respect to the formation of the interface between the organic semiconductor film 30 and the second gate dielectric film 40b, the alternative embodiments shown in FIGS. 11A to 11C are possible.

For example, as shown in FIG. 11A, an organic transistor 1E according to an alternative embodiment includes an organic semiconductor film 30 provided astride a source electrode 20a and a drain electrode 20b; a second gate dielectric film 40b that is provided to contact the top surface 30a of the organic semiconductor film 30 facing the gate electrode 50, and has the width that is, for example, smaller than the interval between the source electrode 20a and the drain electrode 20b and is substantially the same as the width of the gate electrode 50; and a first gate dielectric film 40a that covers the source electrodes 20a, the drain electrode 20b, the organic semiconductor film 30, and the second gate dielectric film 40b.

As mentioned above, carriers (holes or electrons) move in the organic semiconductor film 30 near its top surface 30a facing the gate electrode 50. Therefore, when the second gate dielectric film 40b is provided to contact the top surface 30a at least partially and preferably over the width substantially the same as the width of the gate electrode 50, this inhibits the formation of trap levels that hinder the movement of carriers, and thus facilitates the carrier transport.

In order to inhibit the formation of trap levels to achieve high carrier mobility, it is preferable to form the second gate dielectric film 40b to entirely cover the top surface 30a of the organic semiconductor film 30 facing the gate electrode 50 as in an organic transistor 1F according to an alternative embodiment shown in FIG. 11B. As result, as compared with the organic transistor 1E of the above alternative embodiment, higher carrier mobility can be achieved.

Further, as in an organic transistor 1G according to an alternative embodiment shown in FIG. 11C, when the organic semiconductor film 30 formed between the source electrode 20a and the drain electrode 20b has a side surface 30b continues to the top surface 30a facing the gate electrode 50, it is more preferable to form the second gate dielectric film 40b to cover the organic semiconductor films 30 including the side surface 30b.

As a result, the surfaces of the organic semiconductor film 30 where carriers are expected to transfer are entirely covered with the second gate dielectric film 40b, and, therefore, high carrier mobility can be more reliably achieved.

The alternative embodiments shown in FIG. 11A to 11C are applicable not only to top-gate organic transistors but also to bottom-gate organic transistors.

What is claimed is:

1. An organic transistor comprising:
   a source electrode;
   a drain electrode;
   an organic semiconductor film provided between the source electrode and the drain electrode;
   a gate electrode; and
   a gate dielectric film provided between the organic semiconductor film and the gate electrode, the gate dielectric film including a first gate dielectric film in contact with the gate electrode and a second gate dielectric film in contact with the organic semiconductor film, the second gate dielectric film having a hydrocarbon compound containing carbon and hydrogen atoms, wherein
   the second gate dielectric film does not contain any fluorine atoms.

2. The organic transistor according to claim 1, the second gate dielectric film being provided between the source electrode and the drain electrode in a plane view.

3. The organic transistor according to claim 1, the second gate dielectric film being provided to at least cover a top surface of the organic semiconductor film facing the gate electrode.

4. The organic transistor according to claim 3, the second gate dielectric film being provided to cover the top surface of the organic semiconductor film facing the gate electrode and a side surface of the organic semiconductor film continuous to the top surface.

5. The organic transistor according to claim 1, the organic transistor having a top-gate structure, and the first gate dielectric film having a fluorine-atom-containing organic compound.

6. The organic transistor according to claim 5, the fluorine-atom-containing organic compound including a carbocyclic hydrocarbon compound having fluorine atoms evenly bonded to the carbocyclic side chains thereof.

7. The organic transistor according to claim 1, the organic transistor having a bottom-gate structure, and the first gate dielectric film having an inorganic compound or a fluorine-atom-containing organic compound.

8. The organic transistor according to claim 1, the first gate dielectric film having a thickness greater than a thickness of the second gate dielectric film.

9. The organic transistor according to claim 8, the second gate dielectric film having a thickness of 5 nm to 500 nm.

10. The organic transistor according to claim 1, the second gate dielectric film being formed of a hydrocarbon compound having a carbon number of 30 or more.

11. An electro-optical device comprising:
a substrate;
the organic transistor according to claim 1 provided on the substrate;
a pixel electrode electrically connected to the organic transistor; and
an electro-optical material provided on the pixel electrode.

12. Electronic equipment comprising the electro-optical device according to claim 11.

13. A method for producing an organic transistor comprising:
forming a source electrode and a drain electrode on a substrate;
forming an organic semiconductor film between the source electrode and the drain electrode;
forming a second gate dielectric film on the organic semiconductor film, the second gate dielectric film having a hydrocarbon compound containing carbon and hydrogen atoms;
forming a first gate dielectric film on the second gate dielectric film, the first gate dielectric film having a fluorine-atom-containing organic compound; and
forming a gate electrode on the first gate dielectric film, wherein
the second gate dielectric film does not contain any fluorine atoms.

14. The method for producing an organic transistor according to claim 13, the forming of the organic semiconductor film being performed using a liquid-phase process that uses a fluid substance containing a material for forming the organic semiconductor film.

15. The method for producing an organic transistor according to claim 13, the forming of the gate electrode being performed using a liquid-phase process that uses a fluid material for forming an electrode, the fluid material being a dispersion of an electrically conductive polymer or metal particles in an aqueous dispersion medium.

16. A method for producing an organic transistor comprising:
forming a gate electrode on a substrate;
forming a first gate dielectric film to cover the gate electrode, the first gate dielectric film having an inorganic compound or a fluorine-atom-containing organic compound;
forming a second gate dielectric film on the first gate dielectric film, the second gate dielectric film having a hydrocarbon compound containing carbon and hydrogen atoms;
forming a source electrode and a drain electrode on the second gate dielectric film; and
forming an organic semiconductor film between the source electrode and the drain electrode, wherein
the second gate dielectric film does not contain any fluorine atoms.

* * * * *